(12) United States Patent
Williams et al.

(10) Patent No.: US 7,253,939 B2
(45) Date of Patent: Aug. 7, 2007

(54) SUPERCONDUCTOR-BASED MODULATOR FOR EXTREME ULTRAVIOLET (EUV)

(75) Inventors: David L. Williams, San Jose, CA (US); Michael Goldstein, Ridgeford, CT (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/241,588

(22) Filed: Sep. 30, 2005

(65) Prior Publication Data

US 2007/0076283 A1    Apr. 5, 2007

(51) Int. Cl.
    *G02B 26/00*    (2006.01)
(52) U.S. Cl. ................................. 359/237; 359/288
(58) Field of Classification Search ............ 359/237, 359/245, 248, 288, 220, 222, 223, 320, 323, 359/290, 291, 292, 295, 298; 250/504 R
See application file for complete search history.

(56) References Cited

U.S. PATENT DOCUMENTS

| | | | | |
|---|---|---|---|---|
| 5,036,042 A | * | 7/1991 | Hed | 505/182 |
| 5,875,052 A | * | 2/1999 | Shmagin et al. | 359/244 |
| 6,898,781 B2 | | 5/2005 | Singh et al. | |
| 2005/0122603 A1 | * | 6/2005 | Takizawa et al. | 359/857 |

OTHER PUBLICATIONS

"Visualizing the Superconducting Flux Lattice," Scientific American, Feb. 1993, p. 51.
S.W. Han et al., X-Ray Reflectivity Study of Interdiffusion at $YBa_2Cu_3O_{7-x}$ and Metal Interfaces, Jpn. J. Appl. Phys. vol. 42 (2003) pp. 1395-1399.
*Futurescience, Inc.* Superconductors. Sep. 30, 2005 <http://www.futurescience.com/sc.html>.
*Colorado Futurescience, Inc.* 1998 Making High Temperature Superconductors. Jul. 26, 2005 <www.futurescience.com/scpart1.html>.
John F. Seely, et al., "High-efficiency MoRu-Be multilayer-coated gratings operating near normal incidence in the 11.1-12.0-nm wavelength range," Applied Optics vol. 40 No. 31 (2001) pp. 5565-5574.

* cited by examiner

*Primary Examiner*—Hung X. Dang
*Assistant Examiner*—Tuyen Tra
(74) *Attorney, Agent, or Firm*—Blakely, Sokoloff, Taylor & Zafman LLP (57) ABSTRACT

A superconductor-based modulator includes a superconductor coupled to a cold reservoir to receive extreme ultra-violet (EUV) light beams. The light beams are modulated by altering transmission and reflection properties of the superconductor. Magnetic field, temperature, or a combination of both, may be used to control the superconducting properties of the superconductor. The modulator may perform temporal, spatial, and grey-scale modulations. The surface of the superconductor may be patterned with heat or infrared radiation to facilitate light focusing.

20 Claims, 6 Drawing Sheets

$B_C$ and $T_C$ are the critical magnetic field and temperature respectively

SUPERCONDUCTOR-BASED MODULATOR FOR EXTREME ULTRAVIOLET (EUV)

BACKGROUND

1. Field

Modulating an extreme ultraviolet (EUV) light.

2. Background

The extreme ultraviolet (EUV) light commonly refers to the region of spectrum having a wavelength of approximately 13.5 nm. One application of the EUV is in photolithography where reduced feature size (the critical dimension) of a circuit is desired. The EUV may be used for patterning; that is, creating a circuit design by projecting the EUV light on a wafer covered by a mask. The mask blocks the EUV light from entering the covered area. Thus, selective areas of the wafer may be etched according to the circuit design.

As the EUV is highly reflective, conventional system including lens and quartz cannot be used to direct the projection of the EUV light. Thus, EUV mirrors are generally used. Presently, EUV mirrors are made of machined flat materials, usually diamond turned, which are coated with a material with a high index of refraction at 13.5 nm. Ruthenium is commonly used as a coating material, as are stacks of materials that have alternating high and low refractive indices in the EUV region of the spectrum. Examples are MoRu and Be multilayers, which has been disclosed by, for example, J. F. Seely et al. in the article "High-Efficiency MoRu—Be Multilayer-Coated Gratings Operating near Normal Incidence in the 11.1–12.0 nm Wavelength Range," published by Applied Optics, vol. 40, No. 31, pp. 5565–5574. The EUV mirrors are typically used at grazing incidence to enhance the reflection coefficient.

In photolithography, the EUV may be used not only to pattern a wafer with a mask, but also to write the mask. EUV light beams may be modulated such that selective portions of the beams may be projected onto a wafer while the rest of the beams may be directed away from the wafer. As such, the projected beams form a mask pattern on the wafer. Due to the short wavelength, EUV light beams cannot be easily modulated. Conventional mechanical shutters typically have slow modulation speed and therefore do not achieve good performance.

BRIEF DESCRIPTION OF THE DRAWINGS

Embodiments are illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

DETAILED DESCRIPTION

Figure 1:
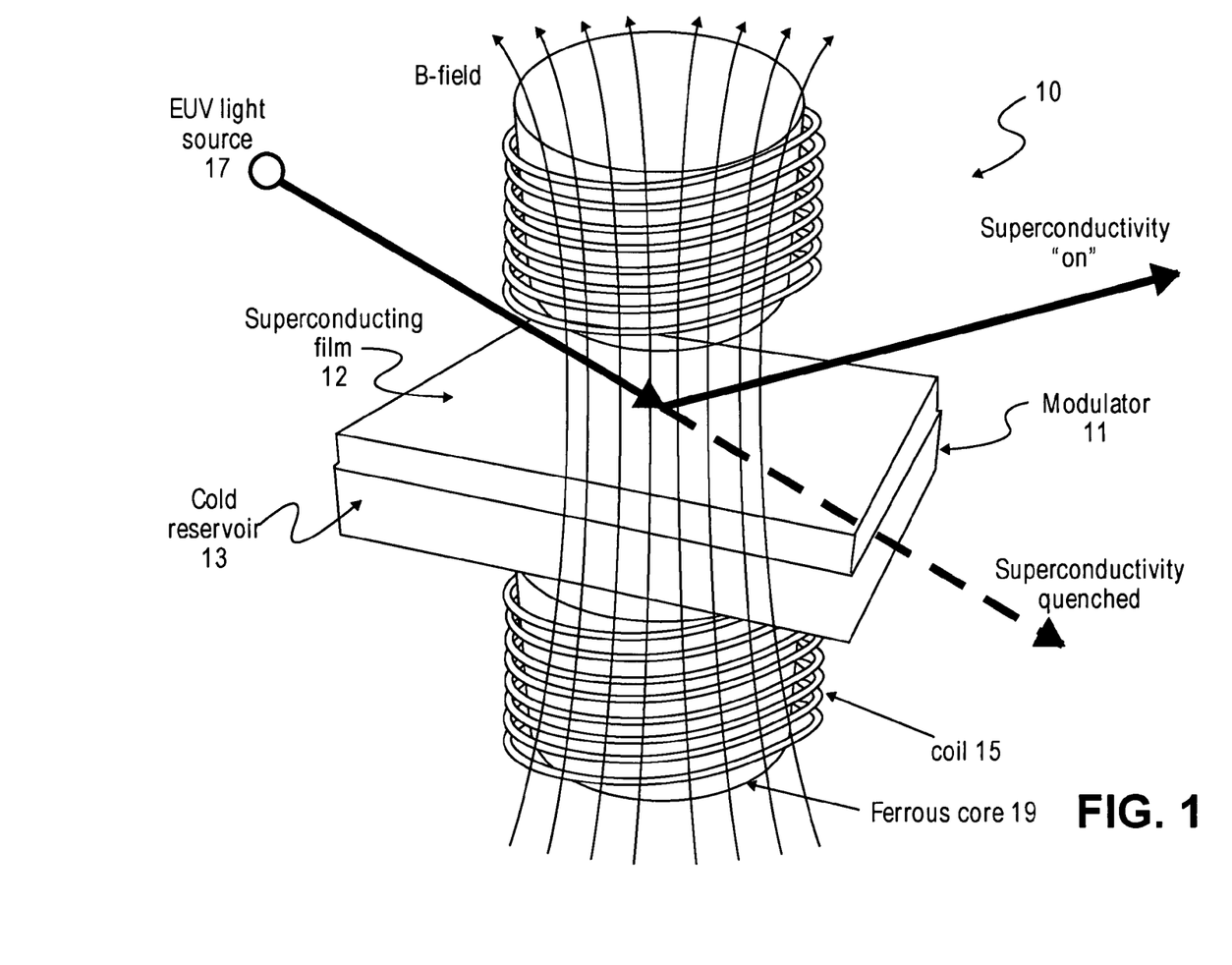
FIG. 1 shows an embodiment of a modulator using electro-magnets to control the superconductivity of a superconductor layer on top of the modulator.

FIG. 1 shows an embodiment of a superconductor-based modulator system 10 using electro-magnets to control the modulation of light. System 10 includes a superconductor-based modulator 11 having a layer of a type II superconductor in the form of a bulk slab or a thin superconducting film 12 coated on a machined mirror surface. The mirror surface may be flat or shaped suitably for focusing light, e.g., curved or concave. A cold reservoir 13 is thermally coupled to superconducting film 12 to maintain the temperature of the superconductor in a superconducting temperature range. Cold reservoir 13 may be a bulk slab of any thermal conductive material, e.g., copper, or a container of refrigerant, e.g., liquid nitrogen. System 10 may also include an extreme ultraviolet (EUV) light source 17 for generating EUV light beams. The EUV light beams may be projected onto the surface of superconducting film 12 at any angle, without being blocked by the electro-magnets. In the embodiment as shown, the incidence angle is 80° with respect to the surface normal. Although the EUV is described in the following discussion, it is understood that modulator 11 may be used to modulate any light beams having a similar wavelength as the EUV, e.g., the X ray.

System 10 may include a switching device to control or switch the superconductivity of superconducting film 12. The switching device may be one or more pairs of electro-magnets (e.g., coils 15) to generate a magnetic field (B-field). Coils 15 may be positioned, without blocking the incident EUV light, in close proximity (e.g., a few centimeters) to the upper and lower sides of modulator 11 to increase magnetic coupling between the magnets and modulator 11. Alternatively, system 10 may include one or more coils positioned below modulator 11 without any coil above the modulator to avoid blocking the incident EUV light. A ferrite core 19 may be inserted into each coil 15 to increase the concentration of the magnetic field. Each coil 15 is electrically coupled to a current controlling device to control the amount of current passing through coil 15 which determines the magnetic field generated by the coil.

In one embodiment, superconducting film 12 may be a high temperature type II superconductor, e.g., $Yba_2Cu_3O_{7-x}$ (hereinafter "YBCO"). Type II superconductors have the property of excluding magnetic field lines below a certain threshold. Type II superconductors are highly reflective in a superconducting mode, but become transmissive in a non-superconducting mode in a strong magnetic field or high temperature. To prepare the YBCO, the following reaction or a similar reaction may be used in a simple laboratory:

$$0.5Y_2O_3 + 2BaCO_3 + 3CuO = Yba_2Cu_3O_{6.5} + 2CO_2$$

Figure 2:
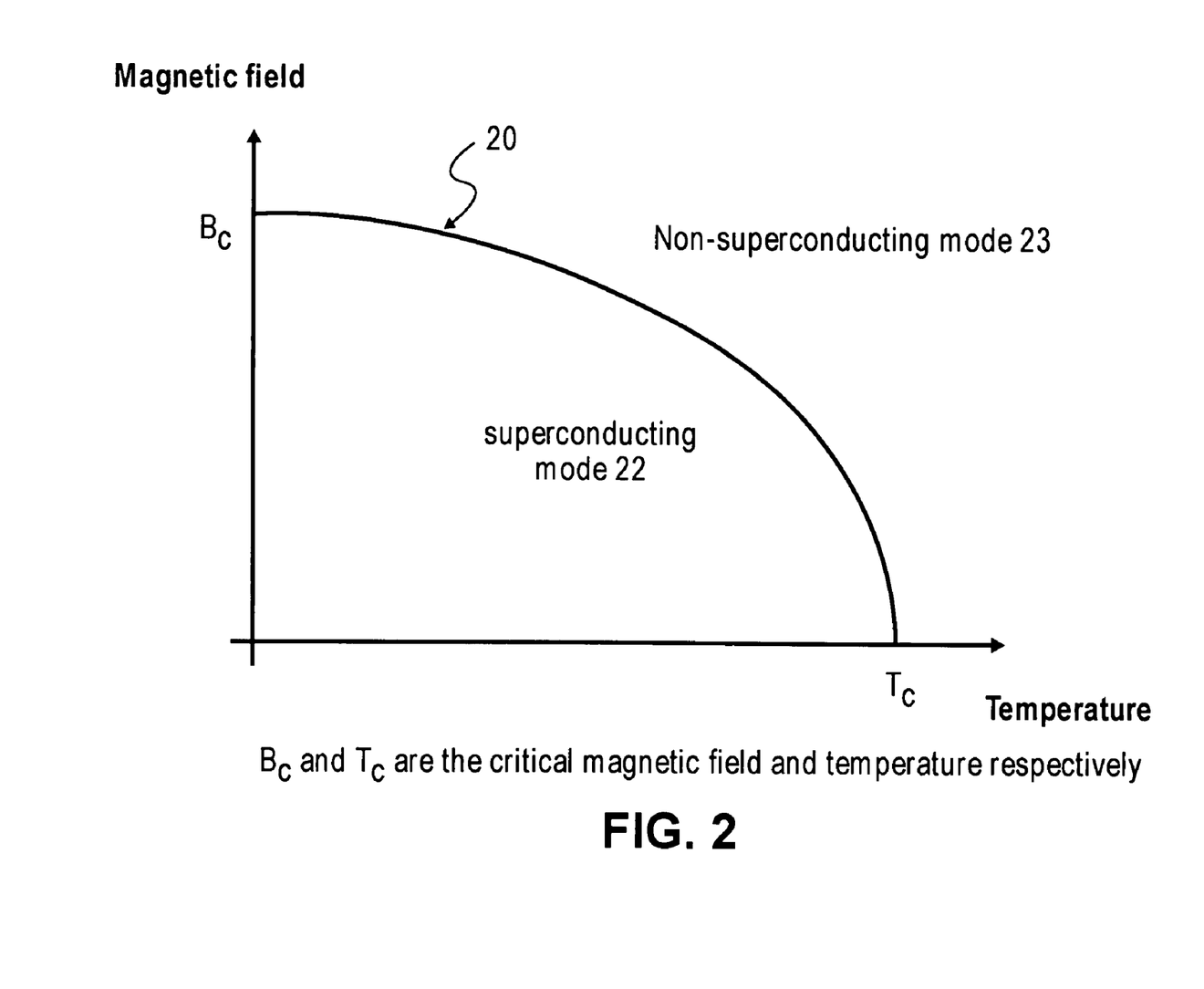
FIG. 2 is a diagram showing a characteristic curve for a typical type II superconductor as a function of magnetic field and temperature.

FIG. 2 is a diagram showing a characteristic curve 20 for a typical type II superconductor (e.g., YBCO) as a function of magnetic field and temperature. Curve 20 defines a superconducting mode 22 and a non-superconducting mode 23. Bc represents the critical (or maximum) magnetic field that the superconductor is able to withstand at absolute zero temperature (0° Kelvin) before becoming non-superconducting. Similarly, Tc represents the critical (or maximum) temperature at zero magnetic field that the superconductor is able to withstand before becoming non-superconducting. The superconductivity of a superconductor is "quenched" when the superconductor becomes non-superconducting. Curve 20 also indicates that, as temperature increases, the Bc required for quenching the superconductivity decreases.

In superconducting mode 22, the superconductor reflects impinging light like a mirror. In non-superconducting mode 23, the superconductor allows light to enter and pass though. Thus, the reflected light beams may be turned on and off as the superconductivity of superconducting film 12 changes.

Referring back to FIG. 1, in operation, the amount of current passing through coils 15 determines the strength of the magnetic field received by modulator 11. By changing the amount of current and hence the magnetic field, the reflectivity of superconducting film 12 changes to direct the incident EUV light into two different directions. Superconducting film 12 either reflects the EUV light like a mirror when the magnetic field is lower than a critical magnetic field, or allows the light to pass through when the magnetic field is stronger than the critical magnetic field.

Modulator 11 may modulate incident light beams temporally, spatially, or a combination of both. Temporal modulation may be achieved by a temporal variation of the current flowing through coils 15. Spatial modulation may be performed by using a plurality of coils 15 positioned across the surface of modulator 11. Each coil 15 may be provided with an individually adjustable amount of current to vary the magnetic field distributed across the modulator surface. The plurality of coils 15 may be positioned on the upper, lower, or both sides of modulator 11. Thus, the EUV light may be modulated by the entire surface area of modulator 11 to form a modulated spatial pattern.

Modulator 11 may perform grey-scale modulation. When the magnetic field is high but before the superconductivity is quenched, superconducting film 12 may have reduced reflectivity to reflect a reduced amount of a light beam. Thus, the spatial pattern created by the modulated light may have some bright portions and some dim portions. In photolithography, the thickness of a mask may be controlled by the brightness of the reflected beams.

In alternative embodiments as discussed below, the modulation of the EUV light may be controlled by temperature or a combination of magnetic filed and temperature. That is, the switching device may be implemented with elements other than coils 15 and may generate heat instead of magnetic fields. It is understood that these alternative embodiments have the same capability as modulator 11 with respect to temporal, spatial, and grey-scale modulations.

Figure 3:
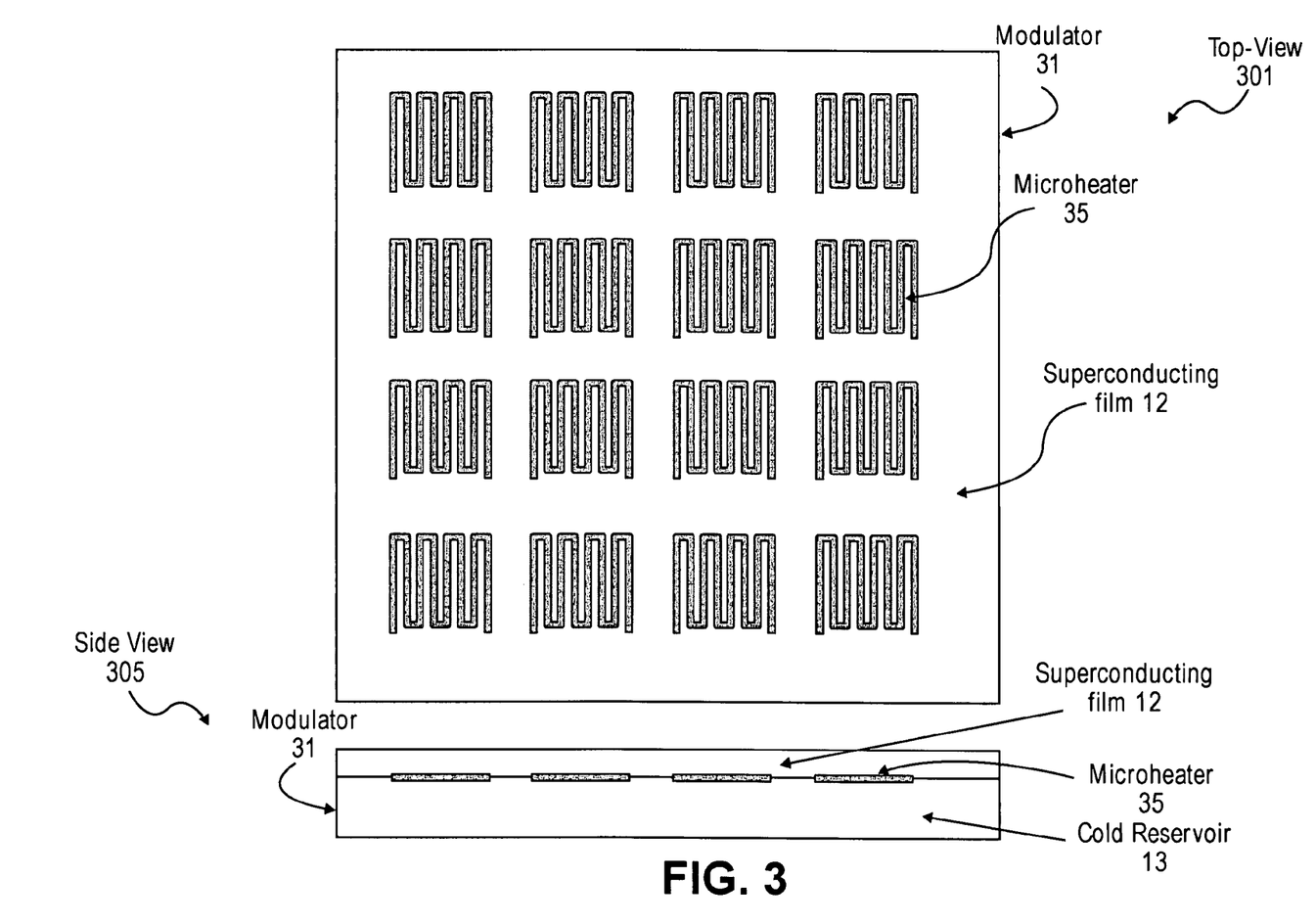
FIG. 3 shows a top view and a side view of another embodiment of a modulator having an embedded micro-heater array for controlling the superconductivity of the superconductor layer.
Figure 4:
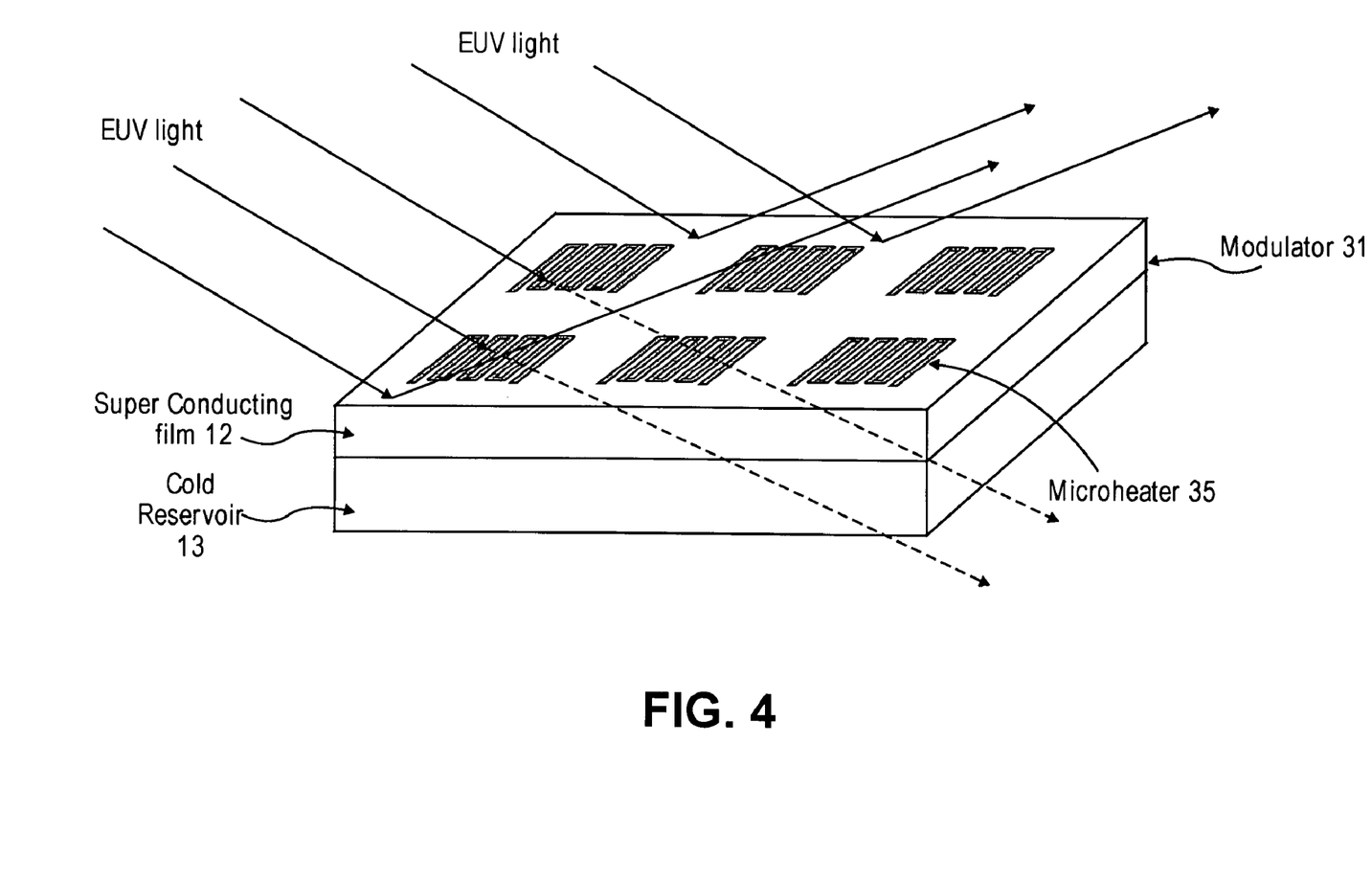
FIG. 4 shows modulating EUV light beams across the surface of the modulator of FIG. 3.

FIG. 3 shows another embodiment of a superconductor-based modulator 31 that uses temperature to control the modulation of the EUV. Top view 301 and side view 305 show modulator 31 as viewed from the top and from the side, respectively. Compared to modulator 11, modulator 31 has additional heating elements that serve to switch or control the superconductivity of superconducting film 12. Below superconducting film 12 is an array of microheaters 35 for heating local parts of the film. In the embodiment as shown, each microheater 35 is formed by a winding strip of heat conductive material, e.g., metal, which includes heat resistive tracks for generating heat as current flows through. Alternative heating elements having other shapes or based on different heating principles may also be used. Microheaters 35 may be coupled to a current controlling device for controlling the amount of current passing through the microheaters. The amount of current determines the amount of heat generated. The current passing through each microheater 35 may be individually controlled to adjust the temperature distribution across the surface of modulator 31. Microheaters 35 when heated above a critical temperature are able to quench the superconductivity of superconducting film 12. The portion of superconducting film 12 heated above the critical temperature cannot reflect light but instead transmits light. By selectively heating parts of all of microheaters 35, the EUV light beams may be modulated by the entire surface of superconducting film 12 as shown in FIG. 4.

Modulator 31 may alternatively use heating elements arranged in the form of gratings, holograms, zone plates, or other suitable arrangements, to allow diffractive focusing or beam manipulation of the EUV light. The heating elements may be embedded under the superconducting film 12.

Figure 5:
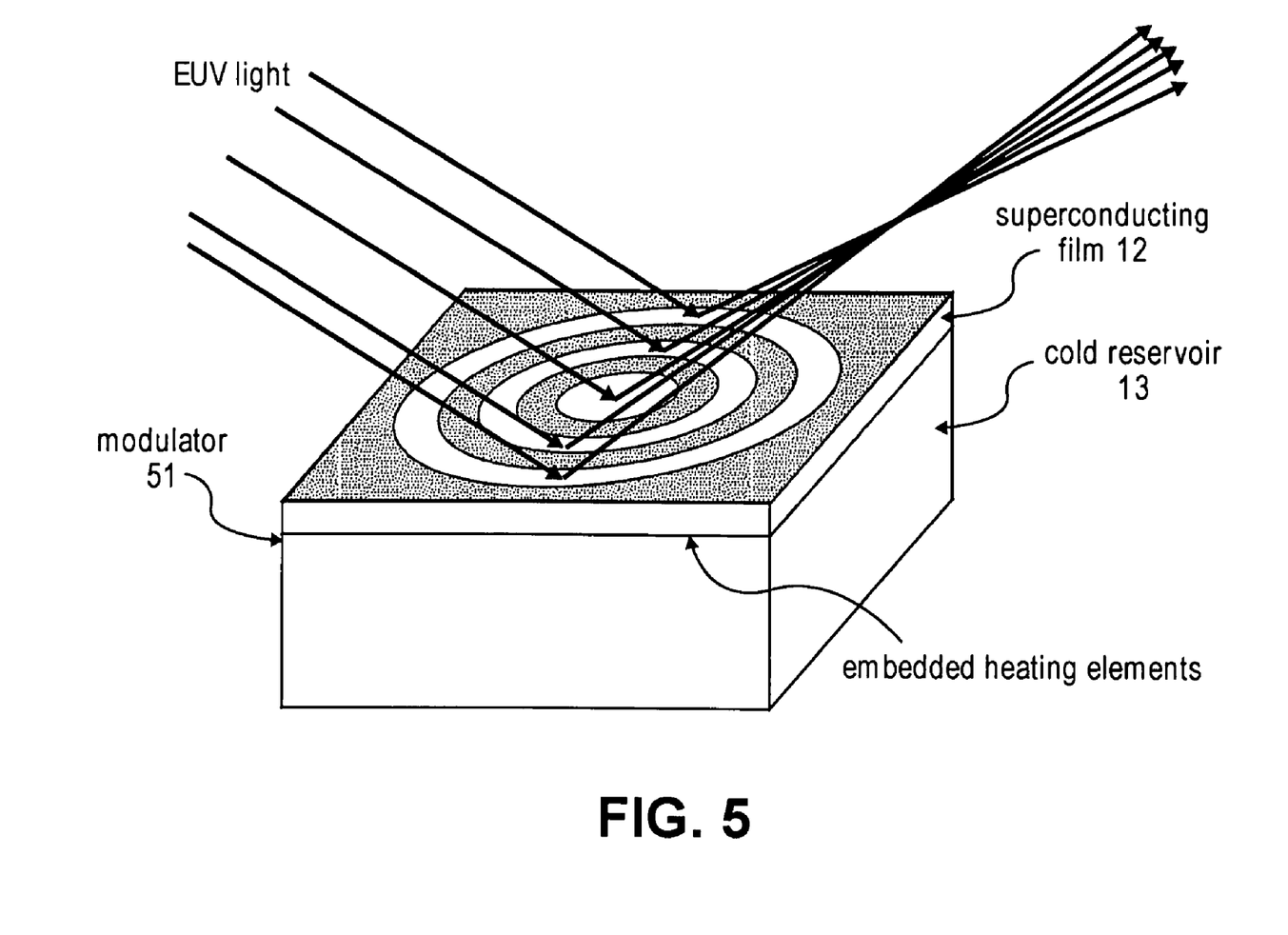
FIG. 5 shows yet another embodiment of a modulator patterned by infrared radiation to form a zone plate.

FIG. 5 shows an alternative embodiment in which superconducting film 12 is heated by an infrared radiation (IR) source 52 projecting the IR thereon. The IR heats up superconducting film 12, raising the temperature above the superconducting transition and thus making a low-reflectivity region of the superconducting material. The IR may create a heated pattern on the surface of superconducting film 12 in the form of gratings, holograms, zone plates, or other suitable shapes, to create similar effects as those created by the equivalent embedded heating elements.

In the embodiment as shown in FIG. 5, the IR patterns the surface of modulator 51 to form a zone plate 53. Dark area of zone plate 53 represents the heated region of superconducting film 12 which does not reflect light, and the light region represents the portion of the film capable of reflecting light. EUV light beams reflected by zone plate 53 may create a more focused projection than without the zone plate. The same zone plate 53 may be similarly created by embedded heating elements.

In an alternative embodiment, modulators 31 or 51 may be placed in a magnetic field, using a combination of magnetic field and temperature to change the superconductivity of superconducting film 12. The magnetic field may be generated by coils 15 as shown in FIG. 1, or other suitable means. Parts of superconducting film 12 may be heated by embedded heating elements or IR patterns. As indicated in FIG. 2, the critical magnetic field decreases as temperature increases. Thus, less magnetic field is required to quench the superconductivity of superconducting film 12 when the temperature is slightly raised.

Figure 6:
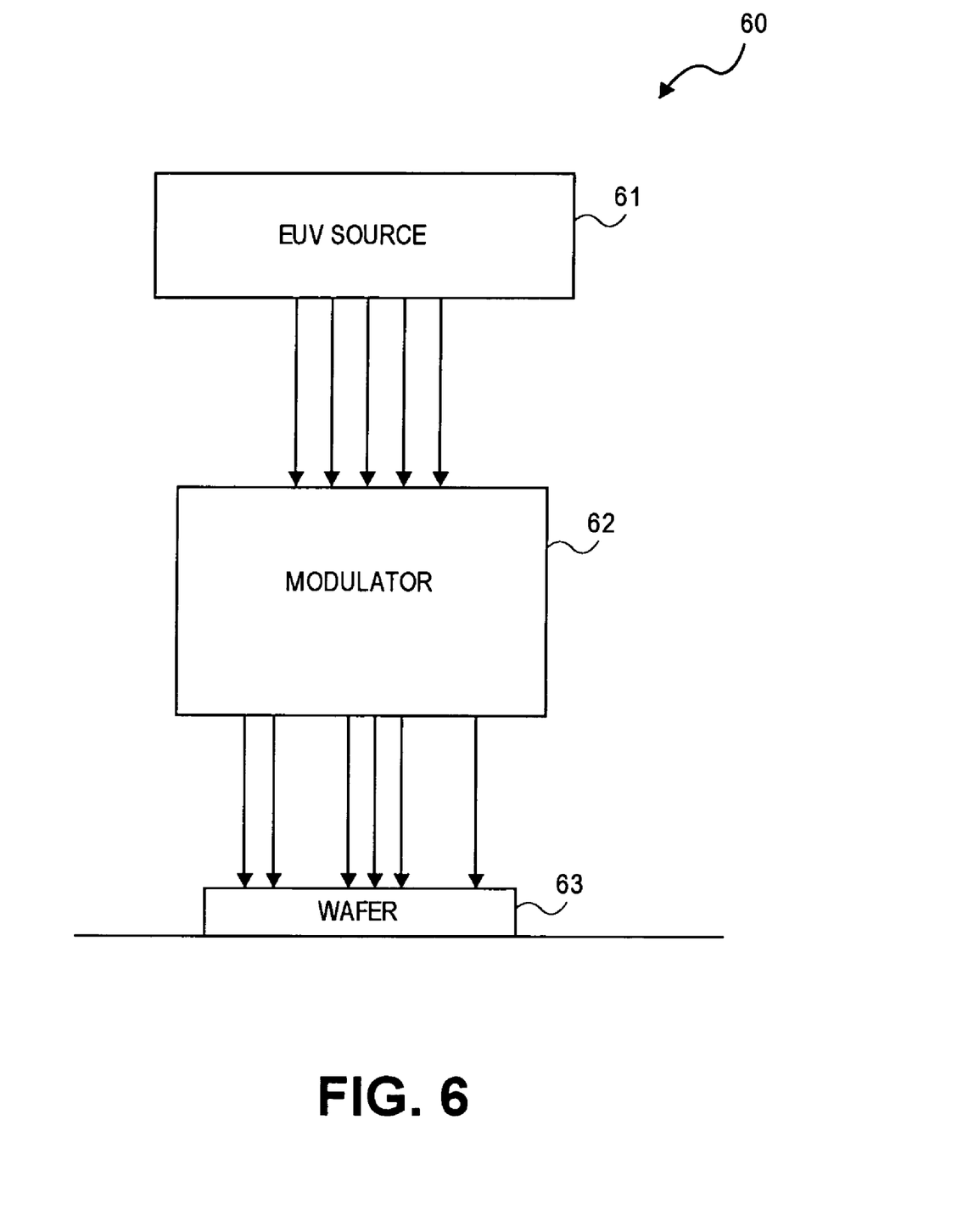
FIG. 6 shows a mask-writing system using a superconductor-based modulator to pattern a mask.

FIG. 6 is a mask-writing system 60 including an EUV source 61, a superconductor-based modulator 62, and a wafer 63. Modulator 62 may be any of modulator 11, 31, 51 as described above, or any modulating device that modulates light by controlling the superconductivity of a superconductor disposed thereon. Modulator 62 receives EUV light beams projected from EUV source 61 and reflects portions of the light beams onto wafer 63 to write an optical mask pattern thereon. The optical mask has a similar effect on wafer 63 as a physical mask of photo-resist does in conventional photolithography. The wafer 63 area receiving the reflected light may be etched away. The wafer 63 area not exposed to the reflected light remains inactive. Some of the reflected light beams may be weaker than others, as a result of grey-scale modulation as mentioned above. Weak reflected light beams may produce a shallower etch than stronger light beams. Thus, a circuit pattern may be formed by the reflection of modulator 62.

In the foregoing specification, specific embodiments have been described. It will, however, be evident that various modifications and changes can be made thereto without departing from the broader spirit and scope of the appended claims. The specification and drawings are, accordingly, to be regarded in an illustrative rather than a restrictive sense.

What is claimed is:

1. A method comprising:
   projecting extreme ultra-violet (EUV) light beams onto a material comprising a superconductor; and modulating the projected EUV light beams by controlling the superconductivity of the superconductor.

2. The method of claim 1 wherein modulating the projected EUV light beam further comprises:
adjusting a magnetic field received by the superconductor to control the superconductivity of the superconductor.

3. The method of claim 1 wherein modulating the projected EUV light beams further comprises:
heating at least a portion of the superconductor to control the superconductivity of the superconductor.

4. The method of claim 1 wherein modulating the projected EUV light beams further comprises:
reflecting portions of the light beams by an area of the superconductor; and
transmitting other portions of the light beams by another area of the superconductor.

5. The method of claim 1 wherein modulating the projected EUV light beams further comprises:
reflecting portions of the light beams and transmitting other portions of the light beams by the same area of the superconductor.

6. The method of claim 1 wherein modulating the projected EUV light beams further comprises:
projecting infrared radiation (IR) onto the superconductor to form a pattern on the superconductor.

7. The method of claim 1 wherein modulating the projected EUV light beams further comprises:
heating at least a portion of the superconductor to form one of following patterns, including a grating, a hologram, a zone plate, and an array of winding strips.

8. An apparatus comprising:
an extreme ultra-violet (EUV) light source to project EUV light beams; and
a modulator to modulate the EUV light beams projected onto the modulator, the modulator comprising a material comprising a superconductor coupled to a cold reservoir.

9. The apparatus of claim 8 further comprising:
one or more magnets to generate a magnetic field received by the superconductor, the magnetic field having adjustable strength.

10. The apparatus of claim 8 wherein the modulator further comprises:
a heated pattern in the form of one of following patterns, including a grating, a hologram, a zone plate, and an array of winding strips.

11. The apparatus of claim 10 wherein the modulator further comprises:
heating elements embedded below the superconductor to generate the heated pattern.

12. The apparatus of claim 10 further comprising:
an infrared radiation (1R) source to generate the heated pattern.

13. The apparatus of claim 8 wherein the superconductor comprises:
a type-II superconductor.

14. A system comprising:
an extreme ultra-violet (EUV) light source to project EUV light beams;
a modulator to modulate the EUV light beams projected onto the modulator, the modulator comprising a material comprising a superconductor coupled to a cold reservoir; and
a switching device to control the superconductivity of the superconductor.

15. The system of claim 14 wherein the switching device comprises:
one or more magnets to generate a magnetic field received by the superconductor, the magnetic field having adjustable strength.

16. The system of claim 14 wherein the modulator further comprises:
a heated pattern in the form of one of following patterns, including a grating, a hologram, a zone plate, and an array of winding strips.

17. The system of claim 16 wherein the switching device further comprises:
heating elements embedded below the superconductor to generate the heated pattern.

18. The system of claim 17 further wherein the switching device further comprises:
an infrared radiation (IR) source to generate the heated pattern.

19. The system of claim 17 wherein the superconductor comprises:
a type-II superconductor.

20. The system of claim 14 further comprising:
a wafer to receive reflection of the EUV light beams from the modulator.

* * * * *

UNITED STATES PATENT AND TRADEMARK OFFICE
CERTIFICATE OF CORRECTION

PATENT NO. : 7,253,939 B2 Page 1 of 1
APPLICATION NO. : 11/241588
DATED : August 7, 2007
INVENTOR(S) : Williams et al.

It is certified that error appears in the above-identified patent and that said Letters Patent is hereby corrected as shown below:

In column 6, at line 6, delete "(1R)" and insert --(IR)--.

Signed and Sealed this

Twenty Second Day of April, 2008

JON W. DUDAS
*Director of the United States Patent and Trademark Office*